US006442036B2

(12) United States Patent
Komatsu

(10) Patent No.: US 6,442,036 B2
(45) Date of Patent: Aug. 27, 2002

(54) SUBSTRATE MOUNT TYPE TERMINAL

(75) Inventor: Toshihiko Komatsu, Nagoya (JP)

(73) Assignees: Autonetworks Technologies, Ltd., Aichi; Sumitomo Wiring Systems, Ltd., Mie; Sumitomo Electric Industries, Ltd., Osaka, all of (JP)

( * ) Notice: Subject to any disclaimer, the term of this patent is extended or adjusted under 35 U.S.C. 154(b) by 0 days.

(21) Appl. No.: 09/768,268

(22) Filed: Jan. 25, 2001

(30) Foreign Application Priority Data

Jan. 31, 2000 (JP) ....................................... 2000-022006

(51) Int. Cl.[7] ........................... H05K 7/12; H01R 11/22

(52) U.S. Cl. ....................... 361/758; 361/752; 361/803; 174/138 G; 439/84; 439/943

(58) Field of Search ................................ 361/752, 742, 361/758, 804, 803; 439/84, 148, 943; 174/138 G

(56) References Cited

U.S. PATENT DOCUMENTS 3,114,586 A 12/1963 Albert
3,486,158 A * 12/1969 Soltysik et al. ............... 439/92
4,050,772 A 9/1977 Birnholz et al.
4,585,295 A 4/1986 Ackerman
5,064,379 A * 11/1991 Ryll et al. .................... 439/81
5,727,761 A * 3/1998 Ho ........................ 248/222.12
5,975,963 A * 11/1999 Higuchi et al. ............. 439/851

FOREIGN PATENT DOCUMENTS

JP 8-264213 10/1996
JP 2000-36343 2/2000

* cited by examiner

*Primary Examiner*—Jayprakash N. Gandhi
(74) *Attorney, Agent, or Firm*—Oliff & Berridge PLC

(57) ABSTRACT

A terminal main body portion 2 of a rectangular cylindrical shape capable of being inserted into an attachment hole formed at a substrate is provided with a male type coupled terminal at its upper end portion and an attachment base portion 5 at its lower end portion. Projection pieces 6 are formed at the lower end portion of the attachment base portion 5 so as to protrude outward. Engagement pieces 7 are formed at positions above the respective projection pieces 6 by a predetermined interval. When the terminal main body portion 2 is inserted into the attachment hole, the substrate mount type terminal 1 is attached to the substrate P in a manner that the substrate P is sandwiched between the projection pieces 6 and the engagement pieces 7 at the peripheral edge portion of the attachment hole.

7 Claims, 8 Drawing Sheets

(Prior Art)

(Prior Art)

SUBSTRATE MOUNT TYPE TERMINAL

BACKGROUND OF THE INVENTION

1. Field of the Invention

The present invention relates to a substrate mount type terminal used for the coupling between a vehicle-mounted electronic unit and a joint box in the wiring with in an automobile, for example.

2. Description of the Related Art

Conventionally, in order to couple an electronic unit and a joint box of an automobile, two kinds of techniques explained bellow have been put to practical use and actually used.

According to the first prior art, as shown in FIG. 12, a plurality of terminals are housed and disposed within a housing and integrated in a predetermined arrangement state thereby to form a connector 100. The connector 100 is attached to an electronic unit side and a connector at the end portions of wire harnesses drawn from a joint box side is coupled to the connector 100.

According to the second prior art, as shown in FIG. 13, a plurality of female terminals 115 are mounted on the substrate 110 of an electronic unit side in a predetermined arrangement state. A connector of wire harness side is coupled to the female terminals 115 thus arranged on the substrate 110.

Each of the female terminals 115 is arranged in a manner that a pair of pin-shaped lead portions 117 are provided so as to elect at the lower portions of a cylindrical terminal main body portion 116 into which a corresponding male terminal is inserted and coupled therewith. Each of the lead portions 117 is inserted into a through hole 110*a* formed at the substrate 110. Then, the lower end portion of each of the lead portions 117 protruded from the lower portion of the substrate, 110 is soldered on a predetermined wiring pattern formed on the substrate 110. Thus, each of the female terminals 115 is electrically coupled to the wiring pattern and also fixed to and mounted on the substrate 110.

According to the second prior art, since the predetermined arrangement and posture of the female terminals is held by directly mounting and fixing each of the female terminals 115 on and to the substrate 110, there is an advantage that the housing of the connector 100 employed in the first prior art can be eliminated.

However, in the case of the second prior art, in a provisional mounting state where the lead portions 117 of each of the female terminals 115 have been inserted into the through hole 110*a* of the substrate 110 but the lead portions 117 have not been soldered on the wiring pattern yet, each of the female terminals 115 is apt to move freely with respect to the substrate 110. Thus, there arises a problem that in case where other members contact to the female terminals 115 at the time of conveying the substrate 110, for example, the alignment of the respective female terminals 115 can not be held in a constant state.

Further, when the respective lead portions 117 are soldered on the wiring pattern, the female terminals 115 also freely move due to the surface tension etc. of the fused solder, so that the alignment of the respective female terminals 115 may also not be held in a constant state.

Furthermore, even in the state where the respective lead portions 117 have been soldered on the wiring pattern, a sufficient fixing force can not be obtained only from the soldering. For example, when the substrate 110 having the female terminals 115 mounted thereon is housed within the casing of the electronic unit, the female terminals 115 may contact to the casing etc., so that it is difficult to keep the alignment of the respective female terminals 115 in a constant state.

In this respect, in order to maintain constant the alignment state of the respective female terminals 115, it may be possible to employ such a method of using a housing for maintaining constant the alignment state of the respective female terminals 115 or a method of using a jig for adjusting the alignment. However, the former method is not suitable since the advantage of the second prior art that the connector housing used in the first prior art can be eliminated is spoiled. Further, the latter method is not suitable since a process of adjusting the alignment is required in addition to the process of mounting the female terminals on the substrate and so the fabricating process of the terminal becomes complicated.

SUMMARY OF THE INVENTION

Accordingly, an object of the invention is to provide a substrate mount type terminal which can maintain predetermined posture on a substrate as possible.

In order to attain the aforesaid object, the substrate mount type terminal according to a first aspect of the invention is arranged in a manner that in the substrate mount type terminal to be mounted on a substrate in which an attachment hole is formed, the substrate mount type terminal includes:

- a terminal main body portion at which a coupling portion capable of being coupled to a coupled terminal in a fitting manner is formed at one end side thereof and an attachment base portion capable of being inserted into the attachment hole is formed at the other end side thereof;
- a projection portion formed so as to protrude outward at an end portion of the terminal main body portion on the attachment base portion side; and
- an engagement portion formed so as to protrude outward at a position of a side portion of the attachment base portion which is away from the projection portion to the coupling portion side by a distance enabling the substrate being sandwiched between the projection portion and the engagement portion.

In a second aspect of the invention, the terminal main body portion may be formed by a member of an almost cylindrical shape which can be inserted into the attachment hole of the substrate and one end side thereof is opened, and the coupling portion is formed as a female coupling portion in a manner that an extended piece extended from the opened end side of the terminal main body portion is turned down toward inside to thereby form a tongue piece for contacting to the coupled terminal side of male type.

Further, in a third aspect of the invention, the engagement portion maybe formed as an engagement piece which extends along insertion direction of the attachment base portion into the attachment hole portion and has a guide edge portion extending a to outside toward a direction opposite to the insertion direction.

Alternatively, in a fourth aspect of the invention, the engagement portion may be formed as an elastic engagement piece which is arranged in a manner that a side plate portion of the attachment base portion is cut and raised outward while remaining the coupling portion side as a coupling base portion and which elastically contacts to a peripheral edge portion of the attachment hole in a state that the terminal is mounted on the substrate.

In this case, in a fifth aspect of the invention, a portion of the side plate portion of the attachment base portion surrounding the elastic engagement piece is cut off at its periphery while remaining a part thereof thereby to form an elastic piece which can elastically deform freely within the cut area.

Further, in a sixth aspect of the invention, in place of arranging the engagement portion so as to protrude outward at the position of the side portion of the attachment base portion which is away from the projection portion to the coupling portion side by the distance enabling the substrate being sandwiched between the projection portion and the engagement portion, the engagement portion maybe arranged in a manner that the engagement portion is formed so as to protrude outward at a position of the side portion of the attachment base portion capable of contacting with pressure to an inner peripheral portion of the attachment hole in a state that the projection portion abuts against other surface of the substrate at a peripheral edge portion of the attachment hole.

Further, in a seventh aspect of the invention, the projection portion may be formed as a projection piece which is disposed along other surface side of the substrate and capable of being soldered to a printed wiring formed on the other surface side by means of reflow soldering.

DETAILED DESCRIPTION OF THE PREFERRED EMBODIMENTS

Now, a description will be given in more detail of preferred embodiments of the invention with reference to the accompanying drawings.

(First Embodiment)

Figure 1:
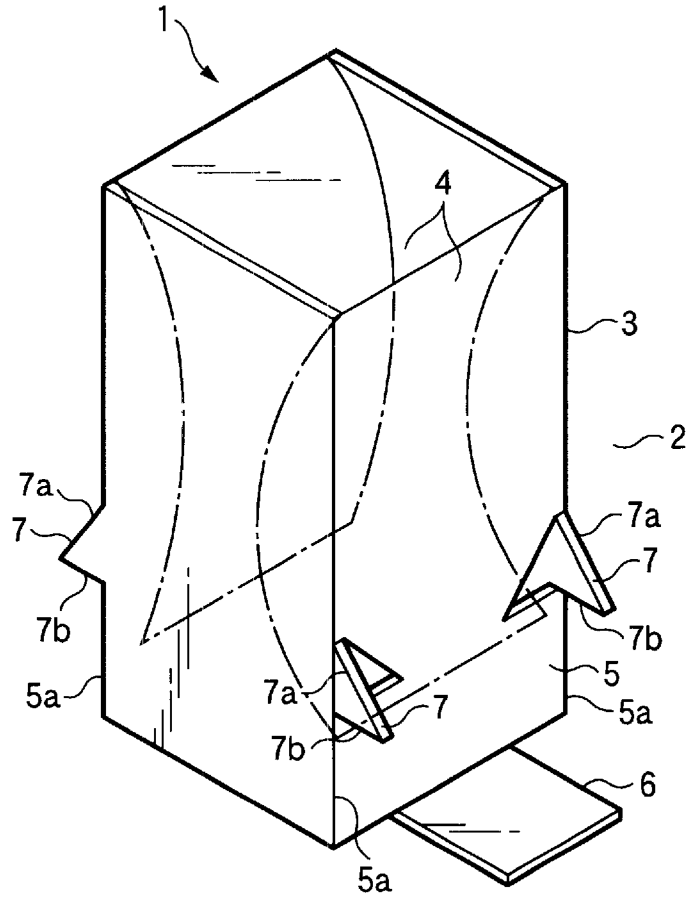
FIG. 1 is a perspective view showing the substrate mount type terminal according to the first embodiment of the invention.
Figure 2:
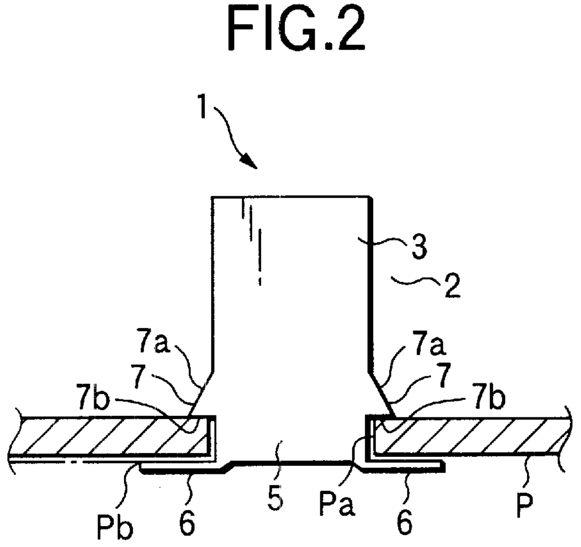
FIG. 2 is a side view partly in section showing a state where the substrate mount type terminal according to the first embodiment is attached to a substrate.

FIGS. 1 and 2 are diagrams showing a substrate mount type terminal 1 according to the first embodiment of the present invention.

The substrate mount type terminal 1 is configured in a manner that it is mounted on a predetermined substrate P such as a printed wiring board used in a vehicle-mounted electronic unit etc. A rectangular attachment hole Pa is formed at the substrate P in advance and the substrate mount type terminal is mounted at the portion where the attachment hole Pa is formed.

That is, the substrate mount type terminal 1 is formed in a predetermined shape by subjecting a metal thin plate to a punching press process etc. The substrate mount type terminal includes a terminal main body portion 2 of a rectangular cylindrical shape, projection pieces 6 formed at the lower end portions of the terminal main body portion 2, and engagement pieces 7 formed at the center portions along the longitudinal or vertical direction of the terminal main body portion 2.

The terminal main body portion 2 is formed in the rectangular cylindrical shape in a manner that the horizontal sectional configuration thereof is a rectangular shape corresponding to the inner peripheral shape of the attachment hole Pa and slightly smaller than the inner peripheral shape, so that the terminal main body portion can be inserted from the upper end side thereof within the attachment hole Pa.

The upper end portion of the terminal main-body portion 2 is opened. A pair of pieces extended from a pair of opposed side plate portions at the opened upper end portion of the terminal main body portion are turned down toward the inside of the terminal main body portion 2 and bent in an expanded shape so as to expand to opposite directions within the terminal main body portion thereby to form tongue pieces 4, respectively. When the plate-shaped tab portion of an of shown male type coupled terminal is inserted into the terminal main body portion 2 from the opened upper end portion side thereof and coupled thereto, the tab portion is made in contact and held with pressure between the tongue pieces 4. Thus, a female coupling portion 3 capable of being coupled with the coupled terminal in a fitting manner is formed at the upper end side of the terminal main body portion 2.

The lower end portion of the terminal main body portion 2 is formed as an attachment base portion 5 which can be inserted into the attachment hole Pa. A pair of projection pieces 6 are formed at the lower end portion of the attachment base portion 5 and further four engagement pieces 7 are formed at the upper portion of the attachment base portion 5.

The projection pieces 6 are formed in a manner that rectangular-shaped pieces extending from the lower end portions of the pair of the opposed side plate portions at the attachment base portion 5 are bent toward the outside so as to protrude outside, respectively. Thus, when the terminal main body portion 2 is inserted from the upper end side thereof within the attachment hole Pa, the projection pieces 6 abut against the lower surface of the substrate P at the peripheral portions of the attachment hole Pa, whereby the terminal main body portion 2 is prevented from coming out of the substrate upward.

Each of the projection pieces 6 is arranged in a manner that it extends to the horizontal direction perpendicular to the axial direction of the attachment base portion 5 and the upper surface thereof is capable of surface-contacting with the lower surface of the substrate P in a state that the attachment base portion 5 is inserted into the attachment hole Pa. In the aforesaid configuration, a predetermined wiring pattern Pb is formed in advance by a copper foil etc. on the lower surface side of the substrate P, then solder paste is coated on the wiring pattern Pb, and then the solder paste is fused during high temperature atmosphere in a state that the terminal 1 is inserted into the attachment hole Pa from the lower direction thereof thereby to contact the respective projection pieces 6 to the wiring pattern Pb. Thus, the respective projection pieces 6 are soldered to the wiring pattern Pb, that is, the substrate mount type terminal 1 is subjected to the reflow soldering to the substrate P as a surface mount type component.

Each of the engagement pieces 7 is formed in a manner that a portion near the outer peripheral corner-portion 5*a* of the side plate portion of the attachment base portion 5 is cut and raised outward from the corner portion 5*a* serving as a base portion. Two of the four engagement pieces 7 are protruded outward like the one of the projection pieces 6 and remaining two of the four engagement pieces 7 are protruded outward like the other of the projection pieces 6.

Each of the engagement pieces 7 is formed at the position above the corresponding projection piece 6 by a distance almost equal to the thickness of the substrate P, and arranged in a manner that the substrate P can be sandwiched between the projection pieces 6 and the engagement pieces in a state that the terminal 1 is inserted from its upper end side into the attachment hole Pa to thereby make the projection pieces 6 contact to the lower surface of the substrate P at the peripheral edge portion of the attachment hole Pa.

Each of the engagement pieces 7 is formed in an almost right-angled triangle plate shape extending along the longitudinal direction (the insertion direction of the terminal main body portion 2 into the attachment hole Pa). The projection edge portion 7*a* on the upper side of each of the engagement pieces is formed as a slanted guide edge portion 7*a* which expands outward along the downward direction (the direction opposite to the insertion direction) Further, the edge portion 7*b* on the lower side of each of the engagement pieces is formed as an abutment portion 7*b* which extends along the horizontal direction perpendicular to the axial direction of the terminal main body portion 2. When the terminal main body portion 2 is inserted from its upper end side within the attachment hole Pa, the respective guide edge portions 7*a* are slidably made in contact with the inner peripheral portion of the attachment hole Pa. Thus, the inner peripheral portion of the attachment hole Pa is elastically deformed so as to be expanded outward largely, and further the respective engagement pieces 7 are elastically deformed so as to be pushed toward the center side of the terminal 1. When the respective engagement pieces 7 move over the inner peripheral portion of the attachment hole Pa, the inner peripheral portion of the attachment hole Pa and the respective engagement pieces 7 are restored to their original configurations, respectively. Accordingly, the abutment portions 7*b* of the respective engagement pieces 7 abut against the upper surface of the substrate P at the peripheral portion of the attachment hole Pa to thereby prevent the terminal main body portion 2 from coming out of the attachment hole toward the downward side.

The substrate mount type terminal 1 thus configured is mounted on the substrate P in accordance with the following procedure.

First, the substrate P is prepared in which the predetermined attachment hole Pa is formed and the predetermined wiring pattern Pb is formed by a copper foil etc. on the lower surface side of the substrate. The wiring pattern Pb is prepared so as to form the predetermined pattern at the portion including the peripheral edge portion of the attachment hole Pa on the lower surface of the substrate P. The wiring pattern is used in order to electrically connect the substrate mount type terminal 1 to other electric components etc. mounted on the substrate P.

Then, solder paste is coated on the wiring pattern Pb formed at the peripheral edge portion of the attachment hole Pa and the substrate mount type terminal 1 is inserted from its upper end side within the attachment hole Pa from the lower direction. The substrate mount type terminal 1 is further pushed into the attachment hole to thereby make the guide edge portions 7*a* of the respective engagement pieces 7 slidably contact to the inner peripheral portion of the attachment hole Pa. Thus, the attachment hole Pa is elastically deformed so as to expanded outward, and further the respective engagement pieces 7 are elastically deformed so as to be pushed toward the center side of the terminal 1, so that the respective engagement pieces 7 move over the inner peripheral portion of the attachment hole Pa. As a result, the respective projection pieces 6 engage with the lower surface side of the substrate P at the peripheral edge portion of the attachment hole Pa and the respective engagement pieces 7 engage with the upper surface side of the substrate P at the peripheral edge portion of the attachment hole Pa, whereby the substrate P can be sandwiched between the projection pieces 6 and the engagement pieces 7 at the peripheral edge portion of the attachment hole Pa. Accordingly, the substrate mount type terminal 1 is provisionally mounted on the substrate in a predetermined posture in a state that the mount type terminal is prevented from coming out of the attachment hole Pa of the substrate P.

Thereafter, the solder paste is melted in a high-temperature atmosphere, so that the respective projection pieces 6 of the substrate mount type terminal 1 are soldered to the wiring pattern of the substrate P and hence the mount type terminal is formally mounted on the substrate.

The substrate mount type terminal 1 is used actually in a state, for example, that a plurality of the terminals 1 are mounted on the substrate P in a predetermined arrangement with a predetermined interval there among. A plurality of the coupled terminals provided at an external connector are coupled to the terminals 1 thus arranged, respectively.

According to the mount type terminal 1 thus configured, the mount type terminal is provided with the terminal main body portion 2 which has on the upper end side thereof the female coupling portion 3 into which the male type coupled terminal can be fit and also has on the lower end side thereof the attachment base portion 5 which is capable of being inserted into the attachment hole Pa, the pair of the projection pieces 6 which are formed at the lower end portion of the terminal main body portion 2 so as to protrude outward, and the four engagement pieces 7 which are formed at the side portions of the attachment base portion 5 so as to protrude outward at the position above the respective projection pieces 6 by such a distance that the substrate P can be sandwiched between the respective projection pieces 6 and the respective engagement pieces. Accordingly, the substrate P can be sandwiched by the projection pieces 6 and the engagement pieces 7 at the peripheral edge portion of the attachment hole Pa in the state that the attachment base portion 5 is inserted into the attachment hole Pa, so that the mount type terminal can be maintained in the predetermined posture as possible on the substrate P.

Further, the terminal main body portion 2 is formed by the almost cylindrical-shaped member which can be inserted into the attachment hole Pa of the substrate P and has an opened upper end side. The pieces extending from the opened end side are turned down toward the inside of the terminal main body portion to thereby form the tongue pieces 4 to be made in contact with the male type coupled terminal side. Thus, since the female coupling portion 3 is formed in this manner, the almost cylindrical-shaped member of the terminal main body portion 2 can be commonly used as the member in which the male type coupling terminal is inserted as well as the attachment base portion 5 which is inserted into the attachment hole Pa of the substrate P. Accordingly, since the configuration of the terminal main body portion is simple, the terminal main body portion can also be manufactured easily.

When the partner-side external connector is provided with a female-type coupled terminal, the terminal main body portion maybe configured to have, in place of the female coupling portion 3, a male-type coupling portion with a plate-shaped tub portion which can be coupled in a fitting manner to the female-type coupled terminal.

Further, each of the engagement pieces 7 is formed in the almost right-angled triangle plate shape extending along the longitudinal direction and the projection edge portion 7*a* on the upper side thereof is formed as the guide edge portion 7*a* which expands outward along the downward direction. Thus, in the case of inserting the terminal main body portion 2 within the attachment hole Pa, the guide edge portions 7*a* slidably contact with the inner peripheral portion of the attachment hole Pa, so that the inner peripheral portion of the attachment hole Pa is apt to be deformed elastically so as to be expanded outward largely, and further the respective engagement pieces 7 are apt to be deformed elastically so as to be pushed toward the center side of the terminal 1. As a result, the respective engagement pieces 7 are able to move over the inner peripheral portion of the attachment hole Pa easily, so that the terminal 1 can be attached to the substrate P easily.

Furthermore, each of the projection pieces 6 is arranged in a manner that it extends along the horizontal surface perpendicular to the axial direction of the attachment base portion 5 and the upper surface thereof is made in surface-contact with the lower surface of the substrate P in the state that the attachment base portion 5 is inserted into the attachment hole Pa. Thus, the solder past can be coated on the wiring pattern Pb formed on the lower surface of the substrate P in advance, and the wiring pattern Pb and the projection pieces 6 can be subjected to the reflow soldering. Therefore, when the soldering process is performed by the reflow soldering method, the substrate mount type terminal 1 hardly moves freely and so the terminal can maintain its predetermined posture.

In this respect, the wiring pattern Pb and the projection pieces 6 are not necessarily subjected to the reflow soldering.

Figure 3:
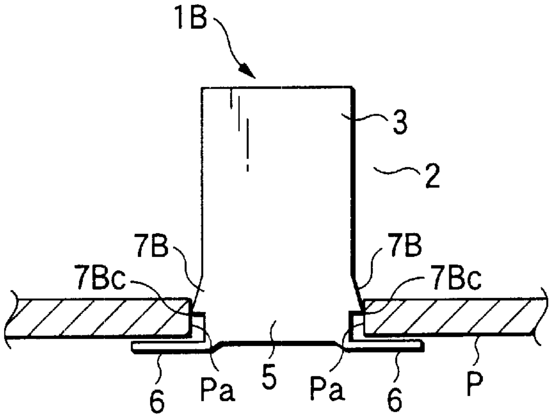
FIG. 3 is a side view partly in section showing a modified example of the substrate mount type terminal according to the first embodiment.

In the first embodiment, like a substrate mount type terminal 1B representing the modified example shown in FIG. 3, the distance between the projection pieces 6 and the engagement pieces 7 may be made slightly shorter than the thickness of the substrate P, and the projection end portions 7B*c* of engagement pieces 7B maybe formed so as to protrude outward at the positions capable of contacting with pressure to the inner peripheral portion of the attachment hole Pa.

In this case, when the projection end portions 7B*c* of the respective engagement portions 7B are made in contact with pressure to the inner peripheral portion of the attachment hole Pa in a state that the terminal main body portion 2 is inserted into the attachment hole Pa and the respective projection pieces 6 abut against the lower surface of the substrate P at the peripheral edge portion of the attachment hole Pa, the substrate mount type terminal 1B can be maintained in a predetermined posture on the substrate P.

(Second Embodiment)

Figure 4:
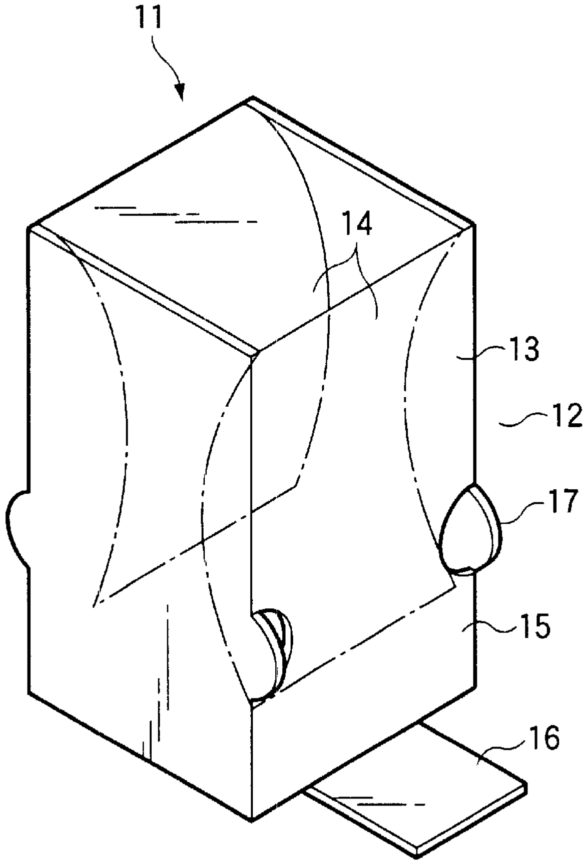
FIG. 4 is a perspective view showing the substrate mount type terminal according to the second embodiment of the invention.
Figure 5:
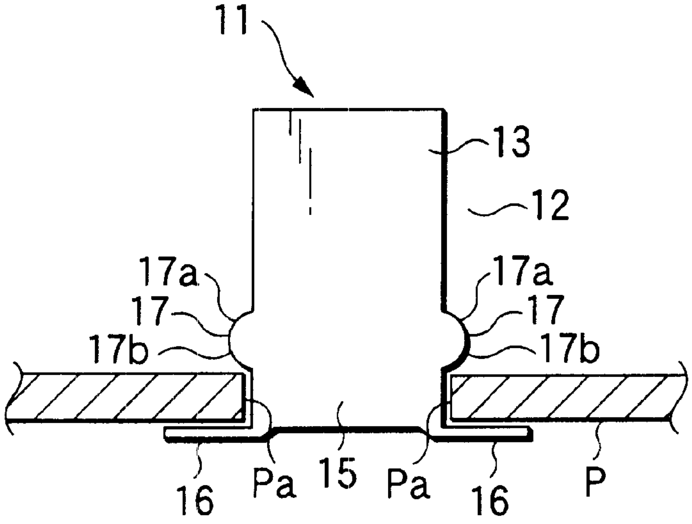
FIG. 5 is a side view partly in section showing a state where the substrate mount type terminal according to the second embodiment is attached to a substrate.

FIGS. 4 and 5 are diagrams showing a substrate mount type terminal 11 according to the second embodiment of the invention. In FIGS. 4 and 5, constituent elements represented by reference numerals 12, 13, 14, 15, 16 are similar to the terminal main body portion 2, the female coupling portion 3, the tongue piece 4, the attachment base portion 5 and the projection piece 6 of the first embodiment, respectively, and the explanation of these constituent elements is eliminated.

In this substrate mount type terminal 11, engagement pieces 17 of a semi-circular plate shape are provided in place of the respective engagement pieces 7 of the first embodiment.

Each of the engagement pieces 17 is formed in a manner that the edge portion 7*a* on the upper side thereof expands outward along the downward direction.

Thus, when the substrate mount type terminal 11 is inserted from its upper end side within the attachment hole Pa, the respective edge portions 17*a* slidably contact with the inner peripheral portion of the attachment hole Pa. Thus, the inner peripheral portion of the attachment hole Pa is elastically deformed so as to be expanded outward largely, and further the respective engagement pieces 17 are elastically deformed so as to be pushed toward the center side of the terminal 11. When the respective engagement pieces 17 move over the inner peripheral portion of the attachment hole Pa, the inner peripheral portion of the attachment hole Pa and the respective engagement pieces 17 are restored to their original configurations, respectively. Accordingly, the projection pieces 16 abut against the lower surface of the substrate P at the peripheral edge portion of the attachment hole Pa and further the edge portions 17*b* on the lower side of the respective engagement pieces 17 abut against the upper surface of the substrate P at the peripheral portion of the attachment hole Pa. Thus, the terminal can be attached and helment hole Pa of the substrate P in a predetermined posture in a state that the terminal main body portion 12 is positioned in the elevational direction.

Accordingly, the substrate mount type terminal 11 according to the second embodiment can also attain the effect similar to that of the first embodiment.

Figure 6:
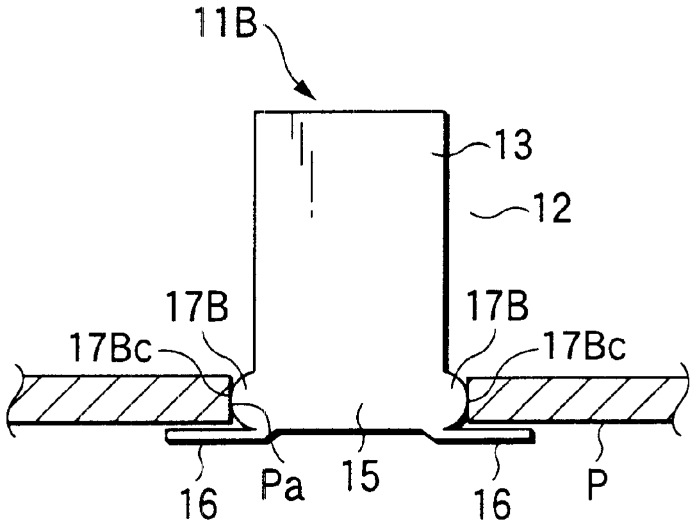
FIG. 6 is a side view partly in section showing a modified example of the substrate mount type terminal according to the second embodiment.

In the substrate mount type terminal 11 according to the second embodiment, like the modified example of the first embodiment, the projection end portions 17B*c* of engagement pieces 17B may be formed so as to protrude outward at positions capable of contacting with pressure to the inner peripheral portion of the attachment hole Pa, like a substrate mount type terminal 11B representing the modified example shown in FIG. 6.

In this case, when the projection end portions 17B*c* of the respective engagement portions 17B are made in contact with pressure to the inner peripheral portion of the attachment hole Pa in a state that the terminal main body portion 12 is inserted into the attachment hole Pa and the respective projection pieces 16 abut against the lower surface of the substrate P at the peripheral edge portion of the attachment hole Pa, the substrate mount type terminal 11B can be maintained in a predetermined posture on the substrate P.

(Third Embodiment)

Figure 7:
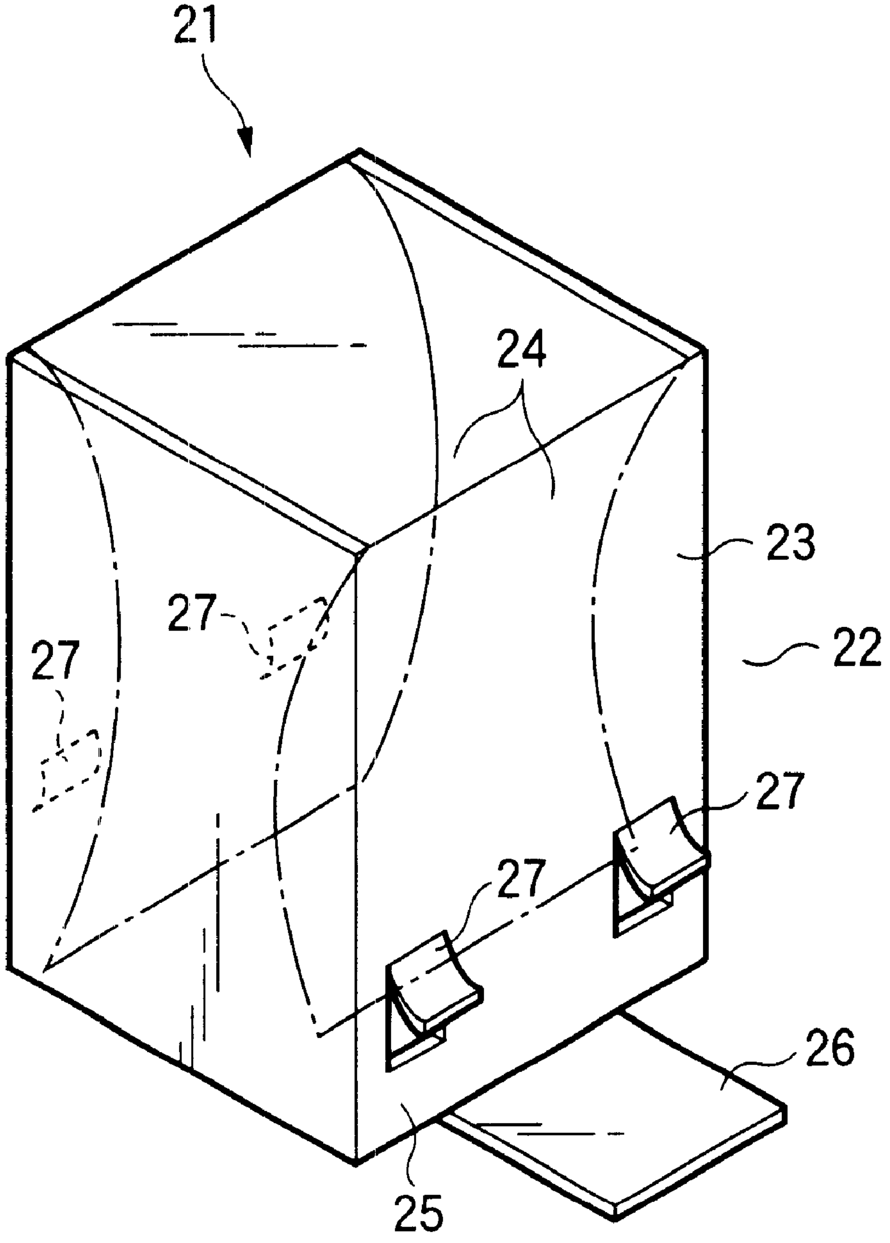
FIG. 7 is a perspective view showing the substrate mount type terminal according to the third embodiment of the invention.
Figure 8:
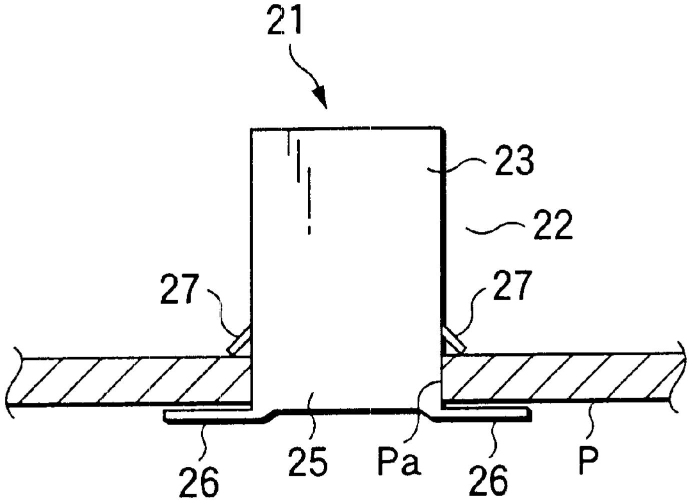
FIG. 8 is a side view partly in section showing a state where the substrate mount type terminal according to the third embodiment is attached to a substrate.

FIGS. 7 and 8 are diagrams showing a substrate mount type terminal 21 according to the third embodiment of the invention. In FIGS. 7 and 8, constituent elements represented by reference numerals 22, 23, 24, 25, 26 are similar to the terminal main body portion 2, the female coupling portion 3, the tongue piece 4, the attachment base portion 5 and the projection piece 6 of the first embodiment, respectively, and the explanation of these constituent elements is eliminated.

In this substrate mount type terminal 21, in place of the respective engagement pieces 7 of the first embodiment, a pair of elastic engagement pieces 27 are provided with a predetermined distance therebetween along the horizontal direction at each of the pair of opposed side plate portions of the attachment base portion 25.

Each of the elastic engagement pieces 27 is formed in a manner that a part of the side plate portion of the attachment base portion 25 is cut out in an almost U-shape while remaining an upper portion thereof as a coupling base portion and the cut-out portion is bent outward so as to form a downward-slanted shape. In this case, the tip end portions of the elastic engagement pieces 27 are arranged so as to elastically contact to the upper surface of the substrate P at the peripheral edge portion of the attachment hole Pa in a state that the terminal main body portion 22 is inserted into the attachment hole Pa and the respective projection pieces 6 abut against the lower surface of the substrate P at the peripheral edge portion of the attachment hole Pa.

According to the substrate mount type terminal 21 thus configured, when the terminal main body portion 22 is inserted into the attachment hole Pa, at first, the outer side slanted surfaces of the respective elastic engagement pieces 27 slidably contact with the inner peripheral portion of the attachment hole Pa, so that the respective elastic engagement pieces 27 elastically deform to the inside. Then, when the terminal main body portion 22 is further pushed into the attachment hole, the respective elastic engagement pieces 27 move over the inner peripheral portion of the attachment hole Pa, so that the respective elastic engagement pieces 27 are restored to their original configurations. Thus, the substrate mount type terminal 21 is mounted on the substrate P in a predetermined posture in a state that the mount type terminal is prevented from coming out of the attachment hole of the substrate, in a state that the respective projection pieces 26 abut against the lower surface of the substrate P at the peripheral edge portion of the attachment hole Pa and the tip end portions of the respective elastic engagement pieces 27 are elastically made in contact with the upper surface of the substrate P at the peripheral edge portion of the attachment hole Pa.

Accordingly, the substrate mount type terminal 21 can be attached to the substrate P while maintained in a predetermined posture as possible on the substrate.

Further, each of the elastic engagement pieces 27 are formed by cutting out the side plate portion of the attachment base portion 25 and electing the cut-out portion outward while remaining the upper portion as the coupling base portion. Thus, when the terminal main body portion 22 is inserted from its upper end side within the attachment hole Pa, the elastic engagement pieces 27 slidably contact to the inner peripheral portion of the attachment hole Pa, so that the respective elastic engagement pieces elastically deform to the inside easily, whereby the respective elastic engagement pieces 27 easily move over the inner peripheral portion of the attachment hole Pa. Therefore, the terminal 1 can be attached to the substrate P easily. Further, after the terminal is attached to the substrate P, since the tip end portions of the respective elastic engagement pieces 27 are elastically made in contact with the upper surface of the substrate P at the peripheral edge portion of the attachment hole Pa, the terminal can be maintained in a predetermined posture as possible on the substrate P.

Figure 9:
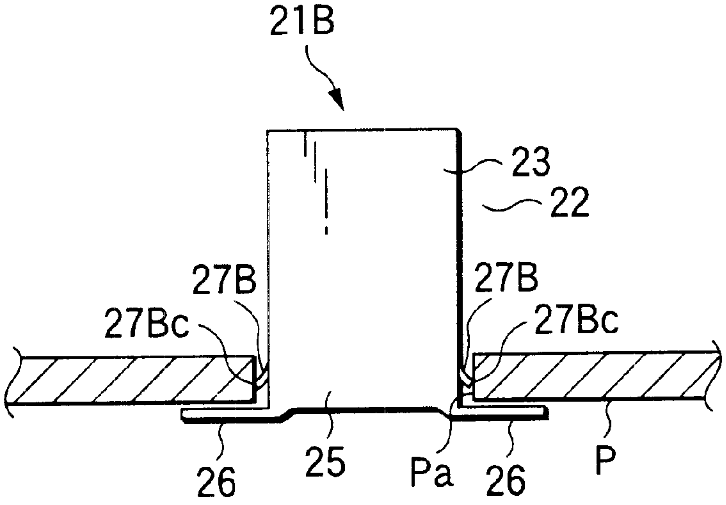
FIG. 9 is a side view partly in section showing a modified example of the substrate mount type terminal according to the third embodiment.

In the substrate mount type terminal 21 according to the third embodiment, like the modified example of the first embodiment, the tip end portions 27B*c* of elastic engagement pieces 27B may be formed so as to protrude at the positions capable of contacting with pressure to the inner peripheral portion of the attachment hole Pa, like a substrate mount type terminal 11B representing the modified example shown in FIG. 9.

In this case, when the projection end portions 27B*c* of the respective elastic engagement portions 27B are made in contact with pressure to the inner peripheral portion of the attachment hole Pa in a state that the terminal main body portion 22 is inserted into the attachment hole Pa and the respective projection pieces 26 abut against the lower surface of the substrate P at the peripheral edge portion of the attachment hole Pa, the substrate mount type terminal 21B can be maintained in a predetermined posture on the substrate P.

(Fourth Embodiment)

Figure 10:
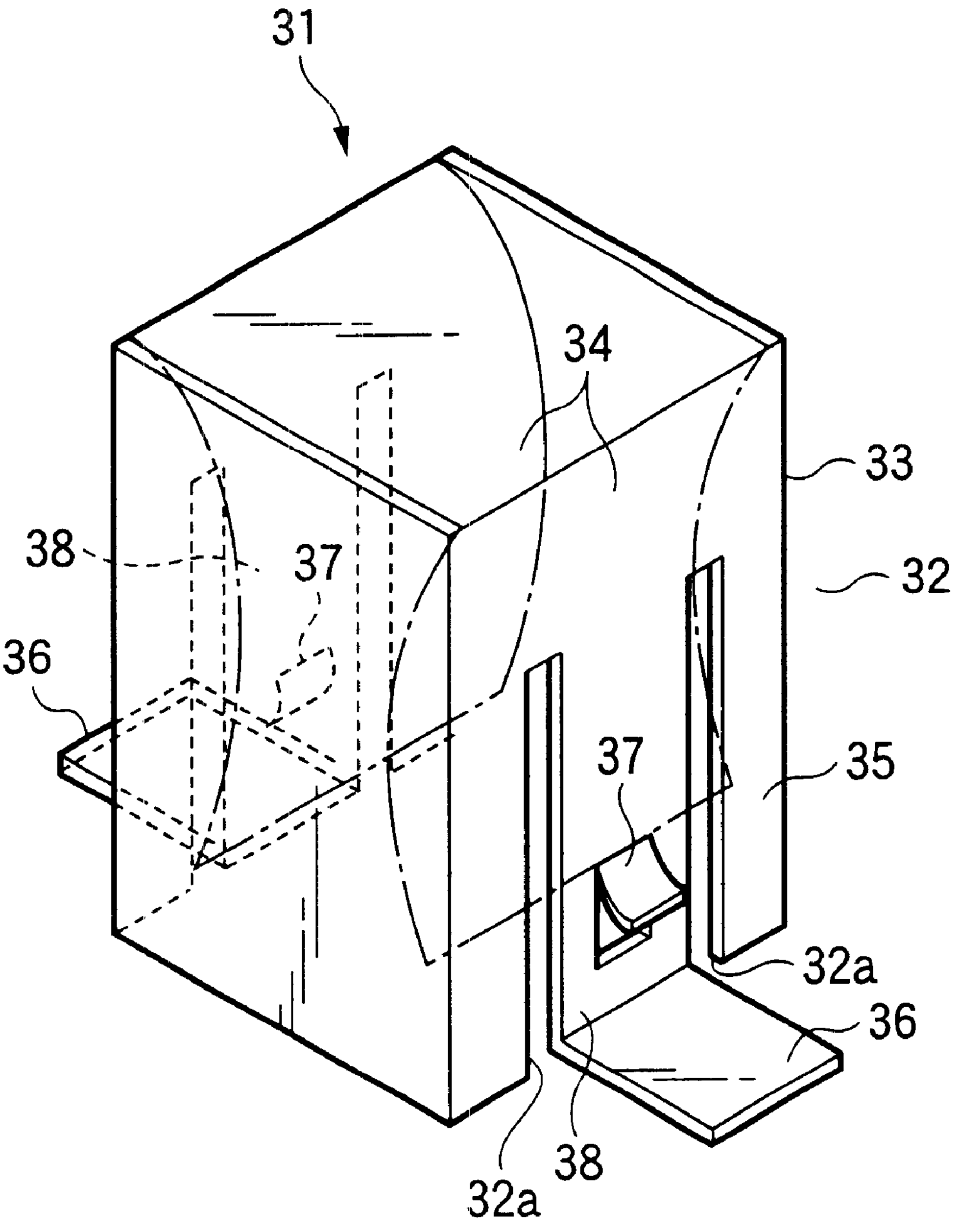
FIG. 10 is a perspective view showing the substrate mount type terminal according to the third embodiment of the invention.
Figure 11:
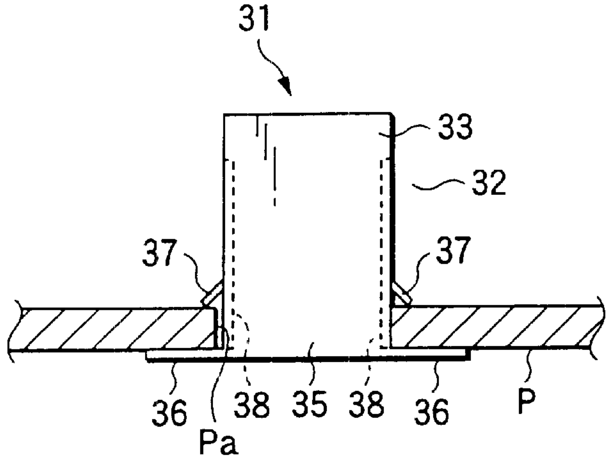
FIG. 11 is a side view partly in section showing a state where the substrate mount type terminal of FIG. 10 is attached to a substrate.
Figure 12:
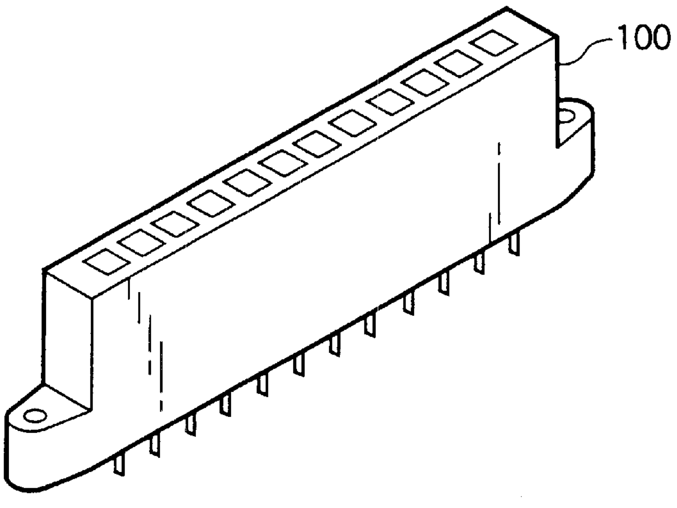
FIG. 12 is a perspective view showing a conventional connector.
Figure 13:
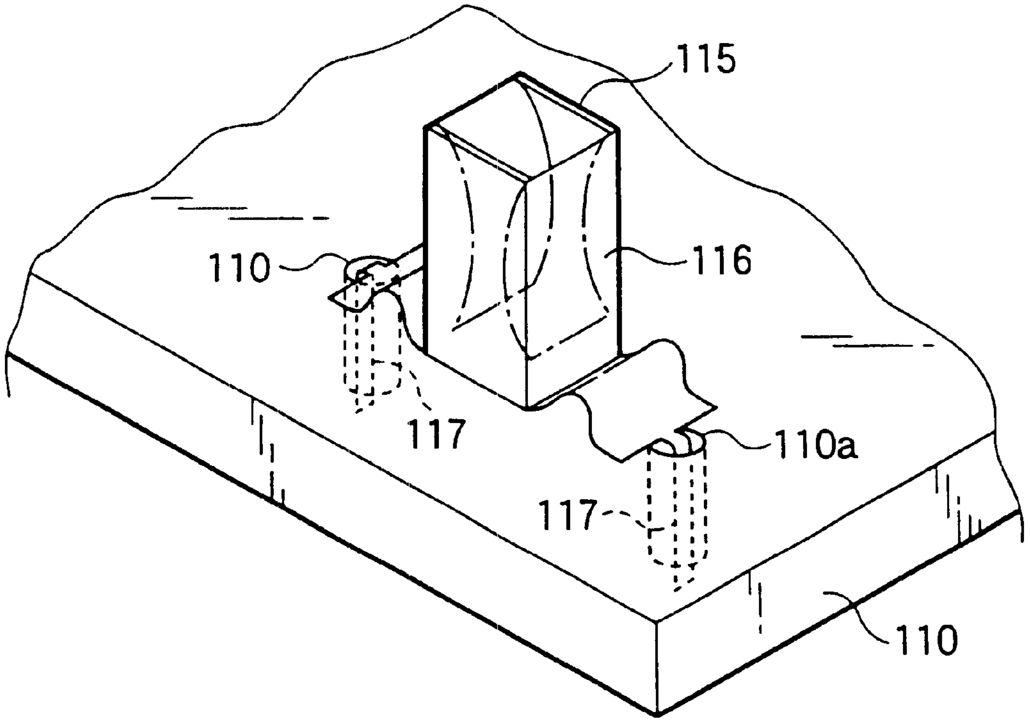
FIG. 13 is a perspective view showing a state where the conventional terminal is attached to a substrate.

FIGS. 10 and 11 are diagrams showing a substrate mount type terminal 31 according to the third embodiment of the invention. In FIGS. 10 and 11, constituent elements represented by reference numerals 32, 33, 34, 35 are similar to the terminal main body portion 2, the female coupling portion 3, the tongue piece 4 and the attachment base portion 5 of the first embodiment, respectively, and the explanation of these constituent elements is eliminated.

In this substrate mount type terminal 31, a pair of vertical slits 32*a* are formed with a predetermined distance therebetween along the horizontal direction at each of the pair of opposed side plate portions of the terminal main body portion 32, whereby elastic pieces 38 are formed each of which is elastically deformed freely and separated from the peripheral portion while remaining an upper portion thereof as a base portion.

The lower end portion of each of the elastic pieces 38 is extended to the side direction to thereby form a projection piece 36. Thus, when the terminal main body portion 32 is inserted from the upper end side thereof within the attachment hole Pa, the respective projection pieces 36 abut against the lower surface of the substrate P at the peripheral edge portions of the attachment hole Pa, whereby the terminal main body portion 2 is prevented from coming out of the substrate upward.

An elastic engagement piece 37 is formed in a manner that a substantially center portion of each of the elastic pieces 38 is cut out in an almost U-shape while remaining an upper portion as a coupling base portion and the cut-out portion is bent outward so as to form a downward-slanted shape. The tip end portions of the elastic engagement pieces 37 are arranged so as to elastically contact to the upper surface of the substrate P at the peripheral edge portion of the attachment hole Pa in a state that the terminal main body portion 32 is inserted into the attachment hole Pa and the respective projection pieces 36 abut against the lower surface of the substrate P at the peripheral edge portion of the attachment hole Pa.

According to the substrate mount type terminal 31 thus configured, when the terminal main body portion 32 is inserted into the attachment hole Pa, at first, the outer-side slanted surfaces of the elastic engagement pieces 37 slidably contact to the inner peripheral portion of the attachment hole Pa. Thus, each of the elastic engagement pieces 37 elastically deforms toward the inside, and each of the elastic pieces 38 is applied with the force toward the inside from the corresponding elastic engagement piece 37 to thereby also elastically deforms toward the inside. When the terminal main body portion 32 is further pushed into the attachment hole, the respective elastic engagement pieces 37 move over the inner peripheral portion of the attachment hole Pa, so that the respective elastic engagement pieces 37 and the elastic pieces 38 are restored to their original configurations, respectively. Thus, the substrate mount type terminal 31 is attached to the substrate P in a state that the mount type terminal is prevented from coming out of the attachment hole of the substrate, in a state that the respective projection pieces 36 abut against the lower surface of the substrate P at the peripheral edge portion of the attachment hole Pa and the tip end portions of the respective elastic engagement pieces 37 are elastically made in contact with the upper surface of the substrate P at the peripheral edge portion of the attachment hole Pa.

Accordingly, the substrate mount type terminal 31 can be attached to the substrate P while maintained in a predetermined posture as possible on the substrate.

Further, the portion surrounding each of the elastic engagement pieces 37 is cut at its periphery while remaining the upper portion thereof thereby to form the elastic portion 38 which can elastically deform freely within the cut area. Thus, when the terminal main body portion 32 is inserted from its upper end side within the attachment hole Pa, the elastic pieces 38 elastically deform easily as well as the elastic engagement pieces 37, so that the respective elastic engagement pieces 37 easily move over the inner peripheral portion of the attachment hole Pa. Therefore, the terminal can be attached to the substrate P easily. Further, after the terminal is attached to the substrate P, since the tip end portions of the respective elastic engagement pieces 37 are elastically made in contact with the upper surface of the substrate P at the peripheral edge portion of the attachment hole Pa, the terminal can be maintained in the predetermined posture as possible on the substrate P.

As described above, according to the substrate mount type terminal of the first aspect, the substrate mount type terminal is arranged to include: a terminal main body portion at which a coupling portion capable of being coupled to a coupled terminal in a fitting manner is formed at one end side thereof and an attachment base portion capable of being inserted into the attachment hole is formed at the other end side thereof; a projection portion formed so as to protrude outward at an end portion of the terminal main body portion on the attachment base portion side; and an engagement portion formed so as to protrude outward at a position of a side portion of the attachment base portion which is away from the projection portion to the coupling portion side by a distance enabling the substrate being sandwiched between the projection portion and the engagement portion. Thus, the substrate can be sandwiched by the projection pieces and the engagement pieces at the peripheral edge portion of the attachment hole in a state that the attachment base portion is inserted into the attachment hole, so that the mount type terminal can be maintained in a predetermined posture as possible on the substrate.

In the second aspect, the terminal main body portion may be formed by a member of an almost cylindrical shape which can be inserted into the attachment hole of the substrate and one end side thereof is opened, and the coupling portion is formed as a female coupling portion in a manner that an extended piece extended from the opened end side of the terminal main body portion is turned down toward inside to thereby form a tongue piece for contacting to the coupled terminal side of male type. Thus, the almost cylindrical-shaped member of the terminal main body portion can be commonly used as the member in which the male type coupling terminal is inserted as well as the attachment base portion which is inserted into the attachment hole of the substrate. Accordingly, since the configuration of the terminal main body portion is made simple, the terminal main body portion can also manufactured easily.

Further, in the third aspect, the engagement portion may be formed as an engagement piece which extends along insertion direction of the attachment base portion into the attachment hole portion and has a guide edge portion extending to outside toward a direction opposite to the insertion direction. Thus, in the case of inserting the terminal main body portion from its one end side within the attachment hole, the guide edge portions slidably contact with the inner peripheral portion of the attachment hole, so that the engagement portions elastically deform easily toward the center side of the terminal main body portion or the attachment hole deforms elastically so as to be expanded outward, so that the engagement pieces can move over the attachment hole easily. Thus, the substrate mount type terminal can be attached to the substrate easily.

Alternatively, in the fourth aspect, the engagement portion may be formed as an elastic engagement piece which is arranged in a manner that a side plate portion of the attachment base portion is cut and raised outward while remaining the coupling portion side as a coupling base portion and which elastically contacts to a peripheral edge portion of the attachment hole in a state that the terminal is mounted on the substrate. Thus, in the case of inserting the terminal main body portion from its one end side into the attachment hole, the elastic engagement pieces slidably contact to the inner periphery portion of the attachment hole and so elastically deform easily to the inner side of the inner periphery portion. Thus, the elastic engagement pieces easily move over the attachment hole and so the terminal can be attached to the substrate easily. Further, after the terminal is attached to the substrate, since the elastic engagement pieces are elastically made in contact with the one surface side of the substrate at the peripheral edge portion of the attachment hole, the terminal can be maintained in a predetermined posture as possible on the substrate.

In this case, in the fifth aspect, a portion of the side plate portion of the attachment base portion surrounding the elastic engagement piece is cut off at its periphery while remaining a part thereof thereby to form an elastic piece which can elastically deform freely within the cut area. Thus, when the elastic engagement pieces deform inside, since the elastic pieces also elastically deform easily to the inside, the terminal can be attached to the substrate more easily.

Further, in the sixth aspect, in place of arranging the engagement portion so as to protrude outward at the position of the side portion of the attachment base portion which is away from the projection portion to the coupling portion side by the distance enabling the substrate being sandwiched between the projection portion and the engagement portion, the engagement portion may be arranged in a manner that the engagement portion is formed so as to protrude outward at a position of the side portion of the attachment base portion capable of contacting with pressure to an inner peripheral portion of the attachment hole in a state that the projection portion abuts against other surface of the substrate at a peripheral edge portion of the attachment hole. Thus, the substrate mount type terminal is mounted on the substrate in a manner that the projection portions abut against the other surface of the substrate at the peripheral edge portion of the attachment hole and also the engagement portions is made in contact with pressure to the inner peripheral portion of the attachment hole in a state that the terminal main body portion is inserted into the attachment hole, the terminal can be maintained in a predetermined posture as possible on the substrate.

Further, in the seventh aspect, the projection portion may be formed as a projection piece which is disposed along other surface side of the substrate and capable of being soldered to a printed wiring formed on the other surface side by means of reflow soldering. Thus, at the time of soldering, the substrate mount type terminal hardly moves freely and so the terminal can maintain its predetermined posture more stably.

What is claimed is:

1. A substrate mount type terminal to be mounted on a substrate in which an attachment hole is formed, comprising:

a terminal main body portion at which a coupling portion capable of being coupled to a coupled terminal in a fitting manner is formed at one end thereof and an attachment base portion capable of being inserted into said attachment hole is formed at the other end thereof, the coupling portion and the attachment base portion being sized for insertion through the attachment hole in an insertion direction such that the attachment base portion is located adjacent the substrate and the coupling portion projects from a surface of the substrate;

a projection portion formed to protrude outward from the insertion direction at an end portion of said terminal main body portion adjacent said attachment base portion;

an engagement portion formed to protrude outward from the insertion direction at a side portion of said attachment base portion and spaced from said projection portion toward said coupling portion by a distance enabling said substrate to be sandwiched between said projection portion and said engagement portion; and said engagement portion is elastically deformable upon insertion through the attachment hole.

2. A substrate mount type terminal according to claim 1, wherein said terminal main body portion is formed by a member of an almost cylindrical shape which can be inserted into said attachment hole of said substrate and one end side thereof is opened, and said coupling portion is formed as a female coupling portion in a manner that an extended piece extended from the opened end side of said terminal main body portion is turned down toward inside to thereby form a tongue piece for contacting to the coupled terminal side of male type.

3. A substrate mount type terminal according to claim 1, wherein said engagement portion is formed as an engagement piece which extends along insertion direction of said attachment base portion into said attachment hole portion and has a guide edge portion inclined relative to the insertion direction.

4. A substrate mount type terminal according to claim 1, wherein said engagement portion is formed as an elastic engagement piece which is arranged in a manner that a side plate portion of said attachment base portion is cut and raised outward while remaining the coupling portion side as a coupling base portion and which elastically contacts to a peripheral edge portion of said attachment hole in a state that said terminal is mounted on said substrate.

5. A substrate mount type terminal according to claim 4, wherein a portion of said side plate portion of said attachment base portion surrounding said elastic engagement piece is cut off at its periphery while remaining a part thereof thereby to form an elastic piece which can elastically deform freely within the cut area.

6. A substrate mount type terminal according to claim 1, wherein said engagement portion is protruding outward at said side portion of said attachment base portion for contacting the inner peripheral surface of said attachment hole so that said projection portion abuts against the surface of said substrate at a peripheral edge portion of said attachment hole.

7. A substrate mount type terminal according to claim 1, wherein said projection portion is formed as a projection piece which is disposed along other surface side of said substrate and capable of being soldered to a printed wiring formed on said other surface side by means of reflow soldering.

* * * * *